United States Patent [19]

Webb

[11] 3,958,040
[45] May 18, 1976

[54] SEMICONDUCTOR DEVICE MANUFACTURE

[75] Inventor: Peter William Dellar Webb, Chandlers Ford, England

[73] Assignee: U.S. Philips Corporation, New York, N.Y.

[22] Filed: Aug. 30, 1974

[21] Appl. No.: 502,147

[30]     Foreign Application Priority Data
    Sept. 7, 1973   United Kingdom............... 42131/73

[52] U.S. Cl.................................. 427/94; 156/11; 156/17; 427/82;88;93
[51] Int. Cl.²....................................... H01L 21/02
[58] Field of Search .............. 117/212, 8.5; 156/17, 156/11; 427/82, 88, 93, 94

[56]         References Cited
        UNITED STATES PATENTS

| 3,810,796 | 5/1974 | Skaggs et al. | 156/17 |
| 3,852,104 | 12/1974 | Kooi et al. | 156/17 |
| 3,860,466 | 1/1975 | Workman et al. | 156/17 |

FOREIGN PATENTS OR APPLICATIONS

| 1,208,574 | 10/1970 | United Kingdom |
| 1,208,578 | 10/1970 | United Kingdom |
| 1,208,577 | 10/1970 | United Kingdom |
| 1,235,177 | 6/1971 | United Kingdom |
| 1,235,178 | 6/1971 | United Kingdom |
| 1,235,179 | 6/1971 | United Kingdom |

OTHER PUBLICATIONS

Local Oxidation of Silicon and its Application in Semiconductor Device Technology by Appels et al., Vol. 25, No. 2, Apr. 1970, pp. 118–132.
Phillips Res. Rep., (Netherlands), Vol. 25, No. 2.

Primary Examiner—Ralph Husack
Attorney, Agent, or Firm—Frank R. Trifari; Leon Nigohosian

[57]         ABSTRACT

A method of producing a semiconductor device comprising a silicon body in which there is located an oxide layer that is sunk locally from a surface of said body and over at least part of the thickness of said body, comprising the steps of providing said silicon body, locally providing on said silicon body surface a first masking layer capable of masking the underlying silicon against oxidation, forming a recess in a part of said silicon body at the area at which said sunken oxide layer is to be provided, covering the side walls of said recess with a second masking layer to protect the underlying silicon against oxidation and oxidizing said silicon at the unmasked area at the bottom of said recess to form said sunken oxide layer.

9 Claims, 10 Drawing Figures

SEMICONDUCTOR DEVICE MANUFACTURE

The invention relates to a method of manufacturing a semiconductor device, in which, in a part of a body consisting of silicon, an embedded oxide layer is formed which is sunk locally from a surface of said part in said silicon body over at least a part of its thickness, which method comprises the steps in which a first masking layer is locally provided on the surface, which masking layer masks the underlying silicon against oxidation, a recess is formed in the silicon part at the area of the sunken oxide layer to be provided, and the sunken silicon oxide layer is formed by an oxidation treatment at the area where the silicon is not masked.

The invention further relates to semiconductor devices manufactured by such a method, for example discrete transistors or integrated circuits.

U.K. Pat. Specifications Nos. 1,208,574 to 1,208,578 (PHN 1970) and U.K. Pat. Specificatons Nos. 1,235,177 to 1,235,179 (PHN 2490) describe methods of manufacturing semiconductor devices in which a surface of a silicon body portion is subjected to an oxidation treatment while the said surface is selectively masked against oxidation by a masking layer provided thereon. At the unmasked portion of the said surface an oxide of silicon grows into the silicon to form a silicon oxide layer sunk over at least part of the thickness of the silicon body portion. Such local oxidation of silicon is known by an abbreviated title "LOCOS" and was described in a paper by Appels et al entitled "LOCAL OXIDATION OF SILICON AND ITS APPLICATION IS SEMICONDUCTOR DEVICE TECHNOLOGY" in "Philips Research Reports" Vol. 25, No. 2 (April, 1970), pp. 118–132. The masking layer is for example of silicon nitride, or of silicon nitride on a thin layer (a few hundred Angstroms thick) of silicon oxide.

As is described in U.K. Pat. Specification No. 1,208,577, the silicon oxide layer can be sunk for more than half of its thickness in the silicon portion of the unmasked portion of the surface is subjected to a material removing treatment in addition to the oxidation treatment. Thus it is known to form a recess in the surface where the sunken silicon oxide layer is to be formed. Such a recess can be formed by etching away silicon at the said unmasked portion of the surface prior to oxidation. It can also be formed by oxidising the unmasked portion, etching away the silicon oxide formed and then reoxidising to form the said silicon oxide layer.

The depth of such a recess can be chosen in relation to the desired oxide layer thickness so that the oxide layer is countersunk over substantially the whole of its thickness in the silicon body portion. Silicon oxide has a specific volume of about twice that of silicon from which it has been obtained by oxidation so that to wholly countersink a 2 microns thick oxide layer a recess having a depth of about 1 micron is necessary. In this manner a substantially flat silicon oxide and silicon surface can be obtained in the manufactured semiconductor device. However, the surface resulting from the oxidation is not entirely flat, since a small bump will occur in the edge of the oxide layer adjoining the said masking layer. This small bump has been termed a "bird-head", because of the shape of its cross-section, the bump resulting from the higher specific volume of silicon oxide and the lateral oxidation which occurs at the side walls of the recess. It has been described previously by Appels and Paffen in Philips Research Reports, Vol. 26, No. 3, (June, 1971), pages 157 to 165. When the oxidation masking layer is a composite layer of silicon nitride on silicon oxide, an oxide "beak" is formed in addition to the bird-head; its presence can be explained by an additional supply of oxygen occurring laterally through the thin oxide layer of the composite masking layer.

Although in general these bird-heads and beaks do not prevent the use of LOCOS techniques, it would be advantageous in some applications to reduce the bird-head size.

According to the present invention, a method of the type mentioned in the preamble is characterized in that the side walls of the recess are covered with a second masking layer protecting the underlying silicon against oxidation and the bottom of the recess is exposed to the oxidation treatment.

By so using such second masking layer, grown oxide bird-heads can be significantly reduced in size or even eliminated.

The second masking layer may comprise the same material as used in the first masking layer.

Preferably the second masking layer is provided to adjoin the first masking layer so that lateral oxidation is inhibited over the whole of the side wall of the recess.

While using the first masking layer as an etch-masking layer, the recess can be formed in a simple manner by an etching treatment during which lateral etching occurs at the side wall of the recess beneath the edge of the first masking layer so that the masking layer edge laterally overhangs the recess.

According to a preferred embodiment, such an overhanging masking layer edge can then be used in conjunction with a positive radiation-sensitive resist to provide the second masking layer on the side walls of the recess without it being necessary to align an external mask with respect to the pattern of the first masking layer and recess already provided. In this context, reference is made to U.K. Pat. Specification No. 1,311,509 (PHN 3960) which describes a method of etching a surface using a mask which masks part of the surface from the etchant, including the steps providing the surface to be etched with the said mask in the form of an etch-masking layer which is impermeable to radiation used to expose a photoresist in a subsequent step of the method. A treatment is involved in either the step of providing the mask or a following step whereby a recess is formed between an edge of the masking layer and the underlying part of the surface, whereafter the masking layer and unmasked part of the surface are coated with a positive photo-resist, which photoresist penetrates the said recess below the edge of the masking layer. When the said radiation is directed towards the surface to expose the photoresist, the photoresist in the said recess is shielded from the action of the exposure by the edge of the masking layer. The exposed part of the photoresist is then removed to bare the part of the surface to be etched, after which the bared part of the surface is etched.

In the present specification a positive radiation-sensitive resist in understood to mean a radiation-sensitive resist of which a layer can be obtained whose exposed parts, after exposure to the relevant radiation to which the resist is sensitive, are more soluble in given solvents than are its unexposed parts. Several positive radiation sensitive resists, including photoresist, are commercially available.

According to the last-mentioned preferred embodiment, after forming the recess the second masking layer may be formed as follows. The material of the second masking layer is provided both on the first masking layer and in the recess including the side walls of the recess, the material for the second masking layer is then coated with a positive radiation-sensitive resist which also penetrates beneath the overhanging edge of the first masking layer, radiation for the radiation-sensitive resist is directed towards the surface of said resist, the resist on the side walls of the recess underneath the said overhanging edge of the first masking layer being shielded against exposure, the exposed resist is removed and the material of the second masking layer where not covered by the resist is etched away, the remaining resist whch is present on the part of the material of the second masking layer on the side walls of the recess serving as an etch mask.

When the first masking layer consists of a material such as silicon nitride, the masking layer may be insufficiently opaque to shield by itself a photoresist used as a radiation-sensitive resist under its overhanging edge against the radiation to be used. In that case, preferably a thin opaque layer, for example of a metal, for example aluminium or chromium, is deposited on the masking layer and the recess prior to the provision of the photoresist, so that during the exposure the opaque layer which is present on the masking layer ensures that the photoresist on the side wall of the recess is shielded against exposure.

The second masking layer may consist of a material which can be retained in the manufactured semiconductor device or, according to a preferred embodiment, it may consist of a material which during the oxidation treatment is converted, for example, into an insulating oxide which is retained in the manufactured semiconductor device. For that purpose, silicon nitride is preferably used in the second masking layer. According to a favourable embodiment, the second masking layer may be sufficiently thin so that during the oxidation treatment the whole layer is converted into an insulating oxide. Towards the end of the oxidation treatment, some underlying silicon of the side walls of the recess may be slightly oxidized. In this manner the silicon part which was masked by the first masking layer may laterally be bounded by silicon oxide formed in situ.

An embodiment of the present invention will now be described, by way of example, with reference to the accompanying diagrammatic drawings, in which:

FIG. 10 is a cross-section of a bipolar transistor manufactured using the method of which FIGS. 1, 2 and 5 to 9 show various stages.

Figure 1:
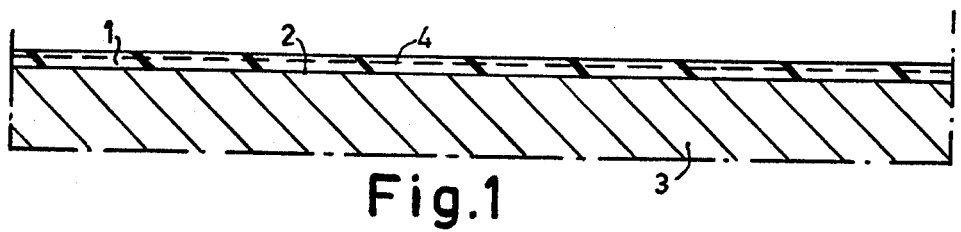
FIGS. 1 and 2 are cross-sections of the portion of a silicon body during initial processing steps in the manufacture of a semiconductor device using LOCOS techniques.

In the LOCOS methods now to be described, a silicon nitride layer 1 (FIG. 1) is provided by deposition on a major surface 2 of a monocrystalline silicon body 3. The silicon nitride may be deposited from a gaseous stream containing for example silane and ammonia while the silicon body is maintained at a temperature of for example, approximately 800 °C. The thickness of the layer may be, for example, 0.15 micron. In FIG. 1 only a portion of the body 3 and layer 1 is shown.

An oxide layer 4 is then formed on the nitride layer 1, for example by thermal oxidation of the nitride or by deposition. In the case of a deposited oxide the layer 4 may have a thickness of, for example, 0.2 micron.

Figure 2:
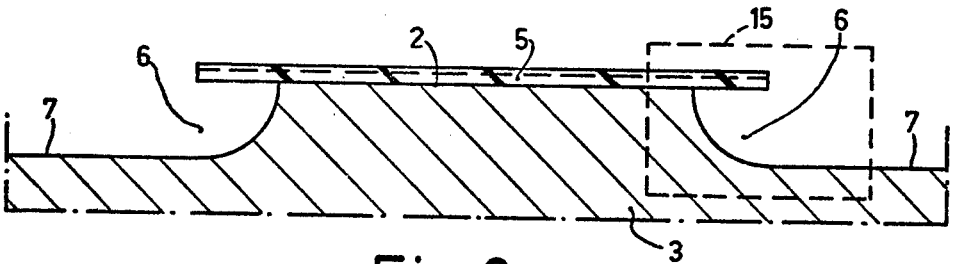

By using a photolithographic etching technique, the oxide layer 4 is selectively removed to provide an oxide mask on the layer 1 to define a desired silicon nitride layer pattern, Using this oxide mask as an etchant mask, the nitride layer 1 is selectively removed by etching in hot phosphoric acid. The remaining nitride serves subsequently as an etchant and oxidation masking layer 5 while locally etching and oxidizing the silicon body portion 3. FIG. 2 shows one such masking layer 5 in the form of an isolated island.

A recess in the form of a moat 6 is now formed in the surface 2 of the silicon body portion 3 by etching away the exposed silicon. The depth of the moat 6 is chosen in accordance with the thickness of the sunken oxide to be formed in situ and with the desired silicon and oxide surface contour. To completely sink the grown oxide, a moat depth of approximately half the oxide thickness is required.

The resulting profile of the silicon surface 2, 7 and nitride masking layer 5 is shown in FIG. 2. Instead of etching the exposed silicon to form this recessed surface, the exposed silicon could be oxidized to partially sink an oxide layer into the surface 2 and this oxide layer can then be etched away to give the same surface structure 2, 7 as shown in FIG. 2. However, this other method involves an additional oxidation step.

Figure 3:
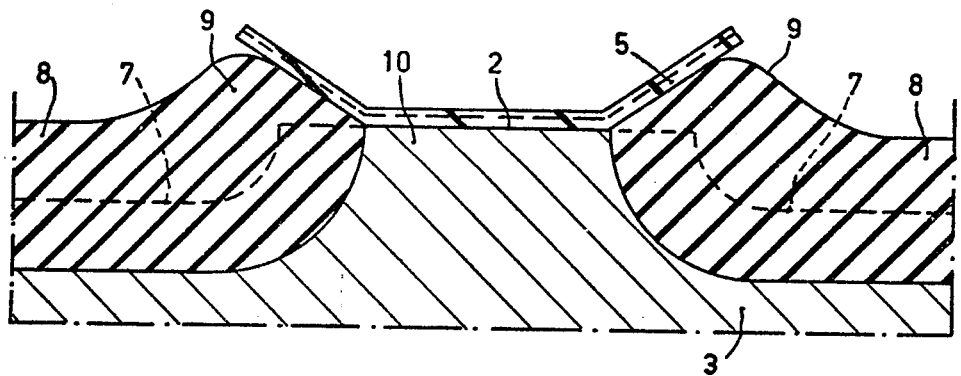
FIGS. 3 and 4 are cross-sections of such a portion as shown in FIGS. 1 and 2 after a conventional LOCOS oxidation step, and showing grown oxide "bird-heads" and "beak"

In a conventional LOCOS process, the recessed silicon surface 2, 7 of FIG. 2 is then subjected to an oxidation treatment, for example, by exposure to wet oxygen at a temperature of 1,000°C. The nitride masking layer 5 masks the remaining part 2 of the original silicon surface against oxidation while an oxide of silicon grows into the unmasked, recessed part 7 to form a silicon oxide layer 8 countersunk in the silicon body portion 3. The resulting structure is shown in FIG. 3. The oxide layer 8 laterally surrounds a mesa-shaped surface part 10 of the body portion 3. The former recessed surface 2, 7 is shown in broken outline. It will be noted that a small bump 9 is present at the edge of the oxide layer 8 which pushes upwards the edge of the nitride masking layer 5. In one particular case, when such a 2 microns thick oxide layer 8 was formed, a bump height of 0.8 micron above the silicon surface 2 has been measured. In general such a bump height is reduced somewhat during subsequent etching, for example when opening contact-windows for the semiconductor device.

Figure 4:
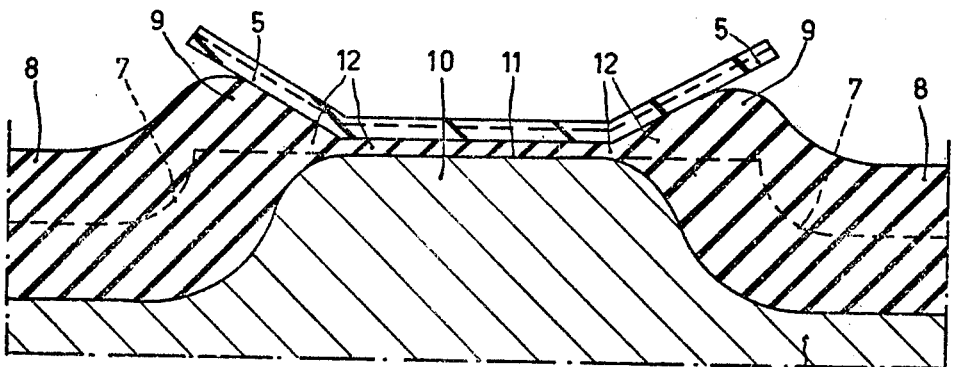

FIG. 4 shows the slightly different structure which results if a masking layer of silicon nitride 5 on a thin layer of silicon oxide 11 is used. In this case, a grown silicon oxide beak 12 is formed at the edge of the sunken oxide layer 8, in addition to a small bump 9.

The bump 9 have been termed "bird-heads" and the beak 12 "a bird-beak" the reason for which will be particularly evident from the oxide cross-section shown in FIG. 4. In general, the bumps 9 result from increasing the volume during the lateral oxidation from the side walls of the moat 6 in that the formed silicon oxide has a higher specific volume than the original silicon. The beak 12 results from increased lateral oxidation along the oxide layer 11 under the nitride layer 5, due to the diffusion of oxygen along the oxide.

However, in the following LOCOS process in accordance with the present invention steps are taken to reduce the oxidation of silicon at the side wall of the moat 6 relative to that at the bottom of the moat 6.

Figure 5:
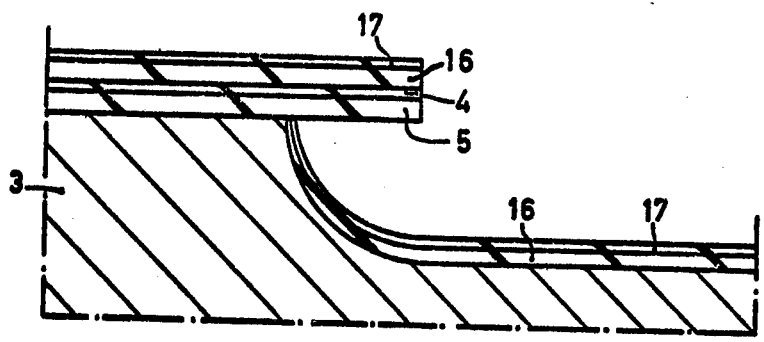
FIGS. 5 to 8 are cross-sections of part of the body portion of FIG. 2 during subsequent processing steps using a novel LOCOS technique in accordance with the present invention.

FIG. 5 is an enlarged view of the part of the structure of FIG. 2 within the box 15 of FIG. 2, and shown after a further silicon nitride layer 16 has been provided on the masking layer 5, hereinafter termed the first masking layer, and on the whole of the exposed silicon surface at the moat 6. On this nitride layer 16 an oxide layer 17 has been provided.

Figure 6:
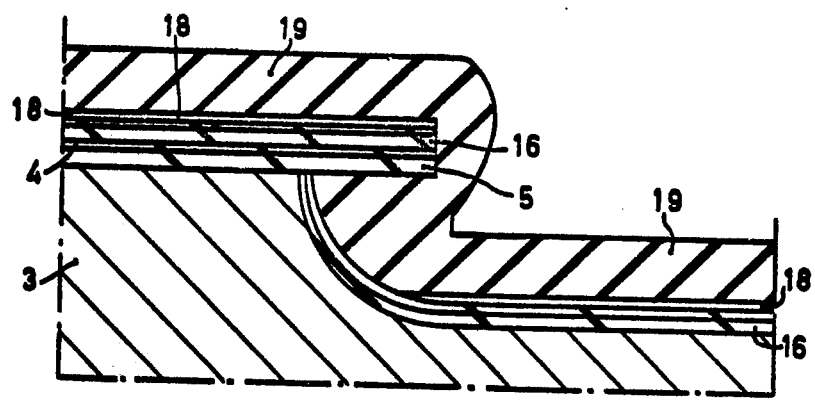

As described hereinafter part of this oxide layer 17 is used subsequently as an etchant-mask during an etching treatment to remove the second nitride layer 16 except where it is present on the side wall of the moat 6, under the overhanging edge of the first masking layer 5. To achieve this, the following steps are performed:

As shown in FIG. 6, a metal such as for example aluminium or chromium is vacuum deposited to form a thin layer 18 on the surface of the layer 16, 17. The whole of the resulting surface is coated in a conventional manner with a layer of a conventional positive photoresist 19 which penetrates below the overhanging edge. Ultra-violet radiation is then directed towards the surface of the photoresist 19 which is thus exposed to the radiation except where it is shielded under the said overhanging edge. It is to ensure that ultra-violet radiation does not penetrate to the resist on the side walls of the moat 6 under this overhanging edge that the thin layer 18 was provided to form an opaque layer on the nitride and oxide layers 5, 4, 16 and 17.

Figure 7:
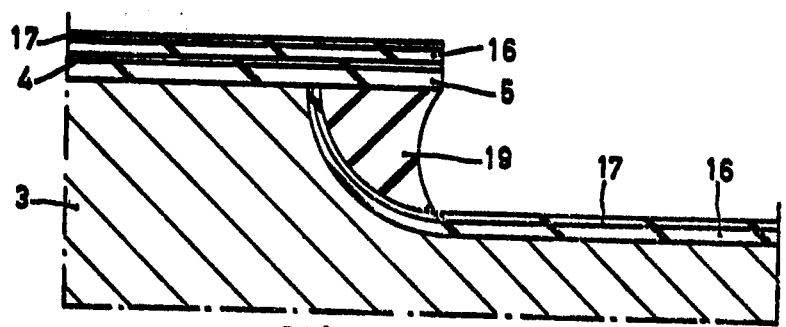

Subsequently, the exposed photoresist is removed by dissolving in a conventional solvent, and the opaque layer 18 so exposed is removed by etching. The resulting structure is shown in FIG. 7.

Figure 8:
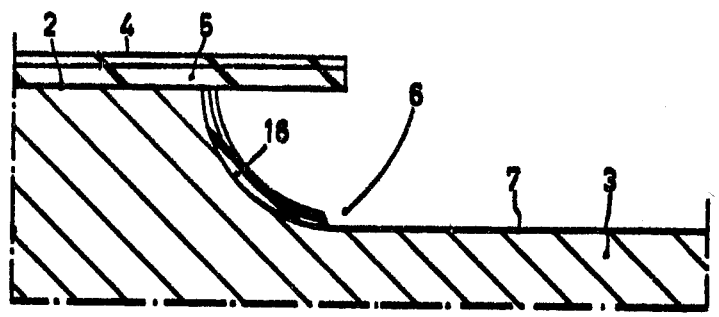

Then, using the remaining photoresist 19 as an etchant mask, the oxide layer 17 where exposed is removed by etching to leave the layer 17 only on the side wall of the moat 6 beneath the overhanging edge. Then, after removing the remaining resist, and using this remaining oxide layer 17 as an etchant mask the second nitride layer 16 where exposed is removed by etching in hot phosphoric acid to leave the layer 16 only on the side wall of the moat 6 beneath the overhanging edge. The resulting structure is shown in FIG. 8. In this manner, there is provided a second masking layer 16 of silicon nitride on the side walls of the moat 6 to adjoin the first nitride layer 5 and to leave the bottom of the moat 6 exposed for the oxidation treatment.

The profiled silicon surface 2, 7 is then subjected to an oxidation treatment, for example by exposure to wet oxygen at a temperature of 1,000°C. During the oxidation silicon oxide is formed at the area where the silicon surface at the bottom of the moat 6 was exposed to form a silicon oxide layer 8 which is countersunk in the silicon body portion 3 and laterally surrounds a mesa-shaped silicon part 10. The remaining surface part 2 at the top of this mesa 10 is masked against the oxidation by the nitride layer 5, only part of the thickness of the layer 5 being converted to silicon oxide by the oxidation. Oxidation at the side wall of the moat 6 is inhibited by the nitride layer 16. The thickness of this nitride layer 16 can be chosen such that the whole layer 16 is converted to silicon oxide by the end of the oxidation treatment. Thus, towards the end of the oxidation treatment the adjacent silicon side wall of the moat 6 may be oxidized so that the edge of the layer 8 adjacent to the silicon mesa 10 is homogeneous with the bulk of the grown oxide layer 8.

The oxidation rate of silicon nitride depends on the density of the nitride layer formed, but is in general between approximately a thirtieth to a fiftieth of that of silicon. It has been found that when growing a 2 microns thick oxide by converting the unmasked silicon, approximately 700 to 800 A of silicon nitride formed from silane and ammonia is oxidised. Therefore when growing layer 8 to a thickness of approximately 2 microns, it is preferable for the second nitride layer 16 to have a thickness of between 700 and 800 A. To achieve such a thickness on the side walls of the moat 6 under the overhanging edge of layer 5, it has proved necessary to deposit silicon nitride in such manner that a greater thickness on the bottom of the moat 6 is obtained see FIG. 5.

Figure 9:
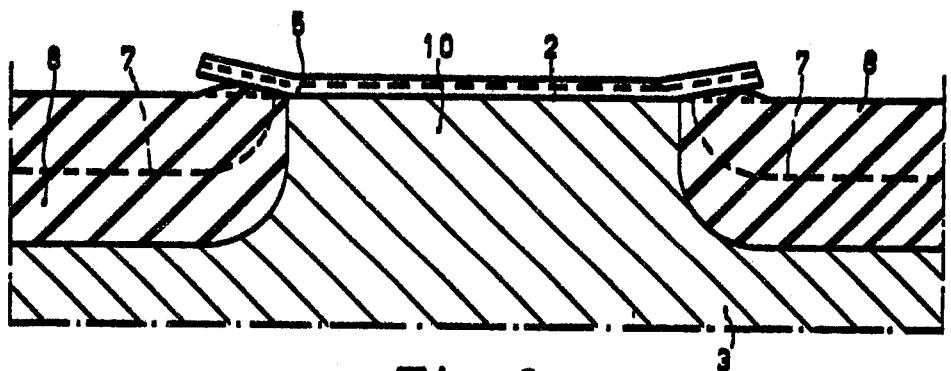
FIG. 9 is a cross-section of the body portion of FIGS. 1, 2, 5, 6, 7 and 8 after oxidation.

The silicon oxide layer 8 resulting from the oxidation treatment is shown diagrammatically in FIG. 9. It will be noted that there is achieved a significant reduction in the height of a bump formed in the oxide layer 8 at its edge with the silicon messa 10. Thus, an even flatter oxide/silicon surface results compared with that shown in FIGS. 3 and 4. The former profiled surface 2, 7 is shown in broken outline in FIG. 9.

Such a flatter LOCOS oxide layer 8 can be used for both discrete semiconductor devices, for example bipolar and field effect transistors, and for circuit elements such as bipolar transistors, field effect devices, and diodes in integrated circuits. In integrated circuits such a layer 8 may be used to provide isolation walls between circuit element regions; thus, the layer 8 may be sunk through a semiconductor layer of one conductivity to a substrate of the opposite conductivity, or to an insulating substrate, for example of sapphire, or to a buried layer of the opposite conductivity type.

Figure 10:
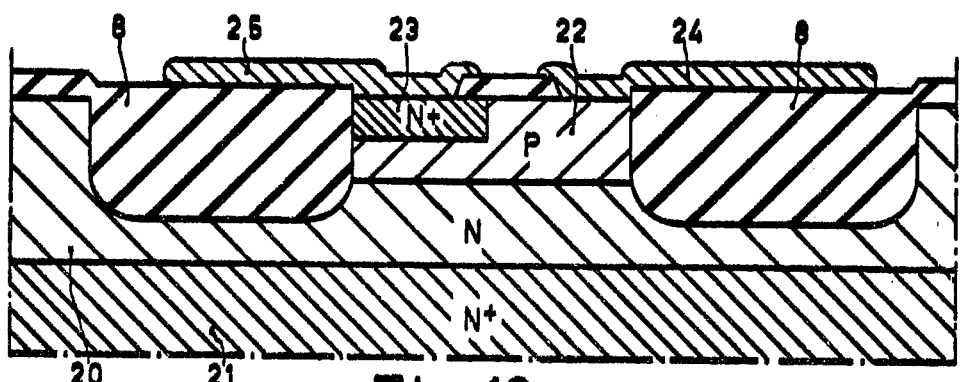

By way of example, FIG. 10 shows such a layer 8 sunk in an *n*-type epitaxial layer 20 on a higher conductivity *n*-type substrate 21. After the oxidation treatment for forming layer 8, a *p*-type base region 22 and an *n*-type emitter region 23 are formed in the silicon mesa 10 so as to adjoin the edge of the sunken grown layer 8. The *n*-type layer 20 and substrate 21 form the collector region of the bipolar transistor. Contact windows are then opened in a thinner silicon oxide layer formed on the silicon surface, and emitter and base metal contact layers 25 and 24 respectively are provided to contact the emitter and base regions 23 and 22 respectively. These contact layers 24 and 25 extend over the edge of the oxide layer 8 and have their major portion located on the oxide layer 8. Because of its flatter edge, the oxide layer 8 can be very thick to reduce the capacitance between contact layers 24 and 25 and *n*-type epitaxial layer 20, without the danger of producing weak spots in the metallization of layers 24 and 25 which could result from a step or high bump at the edge of the layer 8.

It will be evident that many modifications are possible. Thus, for example, a mesa-shaped silicon oxide layer 8 may be formed, by etching the moat 6 to a deeper level before the oxidation so that the oxide layer subsequently formed does not completely fill the moat 6. In that case also, the reduction in height of bird-heads could still be advantageous in such a mesa LOCOD structure, for example for a microwave diode.

Instead of providing the first nitride layer 5 directly on the silicon surface, it may be provided on a thin oxide layer on the silicon surface. In this case, it may be possible to provide the second masking layer 16 to adjoin the nitride layer 5 so as to reduce the extent of a bird-beak as well as the bird-head.

What is claimed is:

1. A method of producing a semiconductor device comprising a silicon body in which there is located an oxide layer that is sunk locally from a surface of said body and that extends over at least part of the thickness of said body, comprising the steps of:
    a. providing said silicon body;
    b. locally providing on said silicon body surface a first masking layer capable of masking the underlying silicon against oxidation;
    c. forming a recess in a part of said silicon body at the area at which said sunken oxide layer is to be provided, said recess extending under a part of said first masking layer;
    d. covering the side walls portions of said recess, which side walls portions are disposed under said first masking layer part, with a second masking layer to protect against oxidation the silicon underlying said second masking layer part; and
    e. oxidizing said silicon at the unmasked area at the bottom of said recess to form said sunken oxide layer.

2. A method as in claim 1, wherein said second masking layer is provided on said side wall portions of said recess and adjoins said first masking layer.

3. A method as in claim 1, wherein said first masking layer is used as an etch-masking layer and said recess is formed by an etching treatment, during which etching treatment lateral etching occurs at the side walls of said recess beneath the edge of said masking layer so that said edge overhangs said recess laterally, said method comprising the further steps wherein, after forming said recess, said second masking layer is provided both on said first masking layer and on said side wall portions of said recess and is then coated with a positive radiation-sensitive resist whch penetrates beneath said overhanging edge of said masking layer, directing radiation for the radiation sensitive resist toward the surface of said resist, whereby the radiation sensitive resist at said side wall portions of the recess underneath said overhanging edge of said first masking layer is shielded against exposure to said radiation, removing the radiation-exposed said resist and etching away the material for said second masking layer at parts thereof that are not covered by the radiation sensitive resist, and using as an etch mask the remaining resist which is present on the part of said second masking layer at said side wall portions of said recess.

4. A method as in claim 3, wherein an opaque layer is provided on said first masking layer to ensure that the photoresist at the side wall portions of the recess is shielded against irradiation during such exposure of said radiation sensitive resist.

5. A method as in claim 4, wherein said opaque layer is metal.

6. A method as in claim 1, wherein during said oxidizing step, at least some of said material of said second masking layer is converted to an insulating oxide which is retained in said device.

7. A method as in claim 6, wherein said second masking layer is sufficiently thin that during said oxidizing step the entire said second masking layer is converted to an insulating oxide.

8. A method as in claim 1, wherein said second masking layer comprises silicon nitride.

9. A method as in claim 1, wherein said sunken silicon oxide layer is grown to a thickness of approximately twice the depth of said recess, thereby obtaining a substantially flat surface for the semiconductor device.

* * * * *

UNITED STATES PATENT OFFICE
CERTIFICATE OF CORRECTION

Patent No. 3,958,040    Dated May 18, 1976

Inventor(s) Peter W. D. Webb

It is certified that error appears in the above-identified patent and that said Letters Patent are hereby corrected as shown below:

Column 1, line 40, change "of" second occurrence to -- if --.

Claim 3, line 11, change "whch" to -- which --.

Signed and Sealed this

Thirty-first Day of August 1976

[SEAL]

Attest:

RUTH C. MASON
*Attesting Officer*

C. MARSHALL DANN
*Commissioner of Patents and Trademarks*